ized Statetates Patent

(12) United States Patent
Sukegawa

(10) Patent No.: US 10,884,197 B2
(45) Date of Patent: *Jan. 5, 2021

(54) OPTICAL RECEPTACLE, OPTICAL MODULE, AND METHOD FOR MANUFACTURING OPTICAL MODULE

(71) Applicant: Enplas Corporation, Saitama (JP)

(72) Inventor: Takayuki Sukegawa, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/467,503

(22) PCT Filed: Nov. 6, 2017

(86) PCT No.: PCT/JP2017/039942
§ 371 (c)(1),
(2) Date: Jun. 7, 2019

(87) PCT Pub. No.: WO2018/105287
PCT Pub. Date: Jun. 14, 2018

(65) Prior Publication Data
US 2020/0073062 A1 Mar. 5, 2020

(30) Foreign Application Priority Data

Dec. 8, 2016 (JP) ................... 2016-238700

(51) Int. Cl.
*G02B 6/42* (2006.01)
*H01L 31/0232* (2014.01)
*H01L 31/12* (2006.01)

(52) U.S. Cl.
CPC ...... *G02B 6/4201* (2013.01); *H01L 31/02325* (2013.01); *H01L 31/12* (2013.01)

(58) Field of Classification Search
CPC .. G02B 6/4206; G02B 6/4214; G02B 6/4239; H01L 31/02325; H01L 31/12
See application file for complete search history.

(56) References Cited

U.S. PATENT DOCUMENTS 10,627,586 B2 * 4/2020 Morioka .............. G02B 6/4206
2004/0202477 A1 10/2004 Nagasaka et al.

FOREIGN PATENT DOCUMENTS

JP 2004-246279 A 9/2004

OTHER PUBLICATIONS

International Search Report from International Application No. PCT/JP2017/039942 dated Feb. 6, 2018.

* cited by examiner

*Primary Examiner* — Quoc D Hoang
(74) *Attorney, Agent, or Firm* — Brundidge & Stanger, P.C.

(57) ABSTRACT

This optical receptacle has an optical receptacle main body, a supporting member, and an adhesive. The optical receptacle main body includes a first optical surface, second optical surface, reflecting surface, first fit-in section, and recessed section. The supporting member includes: a supporting member main body; a second fit-in section fitted in the first fit-in section; and a through hole, which faces the recessed section, and which is opened in the inner-side surface of the supporting member main body, and in the outer-side surface on the reverse side of the inner-side surface. The adhesive is in contact with the inner surface of the recessed section, and the supporting member. The optical receptacle main body is disposed further toward the supporting member side than an installation surface.

12 Claims, 7 Drawing Sheets

OPTICAL RECEPTACLE, OPTICAL MODULE, AND METHOD FOR MANUFACTURING OPTICAL MODULE

TECHNICAL FIELD

The present invention relates to an optical receptacle, an optical module including the optical receptacle, and a manufacturing method of the optical module.

BACKGROUND ART

Conventionally, in optical communications using an optical transmission member such as an optical fiber and an optical waveguide, an optical module including a light emitting element (optical element) such as a surface-emitting laser (e.g. a vertical-cavity surface-emitting laser (VCSEL)) has been used. Such an optical module includes an optical receptacle (optical socket) that operates such that light containing communication information emitted from a light emitting element is incident on an end surface of the optical transmission member (e.g. optical fiber).

For example, PTL 1 discloses an optical module including a substrate, an optical socket disposed on one surface of the substrate, and an optical element disposed on the other surface of the substrate at a position corresponding to the optical socket. A light plug supporting an end portion of a tape fiber is attached to the optical socket. In addition, the optical socket includes a first lens configured to allow entrance of light emitted from an optical element or emit, toward the optical element, light travelling inside from the tape fiber, a second lens configured to allow entrance of light emitted from the tape fiber or emit, toward the tape fiber, light travelling inside from the optical element, and a reflection surface configured to reflect, toward the second lens, light incident on the first lens, or reflect, toward the first lens, light incident on the second lens.

In the optical module disclosed in PTL 1, an optical element is fixed to one surface of the substrate by wire bonding or the like. Thereafter, the optical socket is fixed to the other surface of the substrate such that the optical axis of the optical element and the central axis of the first lens coincide with each other. Then, adhesive agent is applied to at least one of the optical socket and the substrate to bond the optical socket to the substrate.

CITATION LIST

Patent Literature

PTL 1
Japanese Patent Application Laid-Open No. 2004-246279

SUMMARY OF INVENTION

Technical Problem

However, in the optical module disclosed in PTL 1, the optical socket is directly bonded on the substrate, and as such, the space for wire bonding, other optical components, electronic components and the like is limited in the substrate on which the optical socket is fixed. In addition, if the optical socket and the substrate are separated from each other by using a cover and the like for the optical socket, the stress of attaching/detaching the light plug to/from the optical socket may affect the bonding force between the optical socket and the cover.

An object of the present invention is to provide an optical receptacle that can achieve higher degrees of freedom in design of an optical receptacle main body, wire bonding, other optical components and electronic components in comparison with conventional optical sockets. In addition, another object of the present invention is to provide an optical module including the optical receptacle. Yet another object of the present invention is to provide a method of manufacturing the optical module. Yet another object of the present invention is to appropriately maintain the optical coupling between the photoelectric conversion element and the optical transmission member even when the optical transmission member is attached to or detached from the optical receptacle main body in the case where the optical receptacle main body and the substrate are disposed with a space therebetween.

Solution to Problem

An optical receptacle according to an embodiment of the present invention is configured to be disposed between an optical transmission member and a photoelectric conversion device including a photoelectric conversion element disposed on a substrate, the optical receptacle being configured to optically couple the photoelectric conversion element and an end surface of the optical transmission member, the optical receptacle including: an optical receptacle main body; a supporting member configured to support the optical receptacle main body; and an adhesive agent configured to bond the optical receptacle main body and the supporting member. The optical receptacle main body includes a first optical surface configured to allow incidence of transmission light emitted from the photoelectric conversion element, or to emit, toward the photoelectric conversion element, reception light having passed through inside of the optical receptacle main body after being emitted from the end surface of the optical transmission member, a second optical surface configured to emit, toward the optical transmission member, the transmission light having passed through the inside of the optical receptacle main body after being emitted from the photoelectric conversion element, or to allow incidence of the reception light emitted from the optical transmission member, a reflection surface configured to reflect, toward the second optical surface, the transmission light incident on the first optical surface, or to reflect, toward the first optical surface, the reception light incident on the second optical surface, a first fitting part disposed in a surface opposite to a surface where the first optical surface is disposed, and a recess formed on a side of the surface where the first fitting part is disposed. The supporting member includes a supporting member main body including an installation surface for installation to the substrate, a second fitting part disposed in an inner surface of the supporting member main body, the inner surface facing the surface where the first fitting part of the optical receptacle main body is disposed, the second fitting part being fitted with the first fitting part, and a through hole facing the recess of the optical receptacle main body and opening at the inner surface and an outer surface of the supporting member main body, the outer surface being opposite to the inner surface. The adhesive agent is disposed in the recess of the optical receptacle main body such that the adhesive agent makes contact with an inner surface of the recess and the inner surface of the supporting member main body, and the optical receptacle main body is located on a side of the supporting member with respect to the installation surface.

An optical module according to an embodiment of the present invention including: a photoelectric conversion device including a substrate and a photoelectric conversion element disposed on the substrate; and the above-mentioned optical receptacle. The substrate and the optical receptacle main body are separated from each other.

According to an embodiment of the present invention, a method of manufacturing the above-mentioned optical module includes: producing the optical receptacle by injecting the adhesive agent to the recess of the optical receptacle main body from the through hole of the supporting member in a state where the first fitting part of the optical receptacle main body and the second fitting part of the supporting member are fitted with each other, and by curing the adhesive agent to bond the optical receptacle main body and the supporting member to each other, and fixing the optical receptacle to the substrate where the photoelectric conversion element is disposed such that the substrate and the optical receptacle main body are separated from each other.

Advantageous Effects of Invention

According to the present invention, it is possible to provide an optical receptacle that can achieve higher degrees of freedom in design of wire bonding, other optical components and electronic components in comparison with conventional optical sockets.

DESCRIPTION OF EMBODIMENTS

Optical module 100 according to an embodiment of the present invention are elaborated below with reference to the accompanying drawings.

Configuration of Optical Module

Figure 1A:
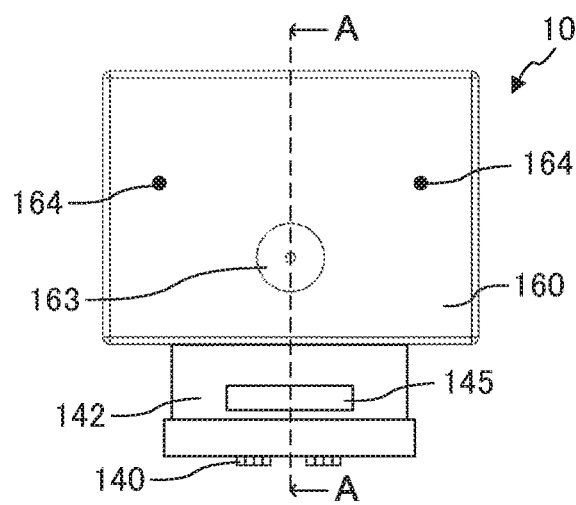
FIGS. 1A to 1E illustrate a configuration of an optical module according to an embodiment of the present invention.
Figure 1C:
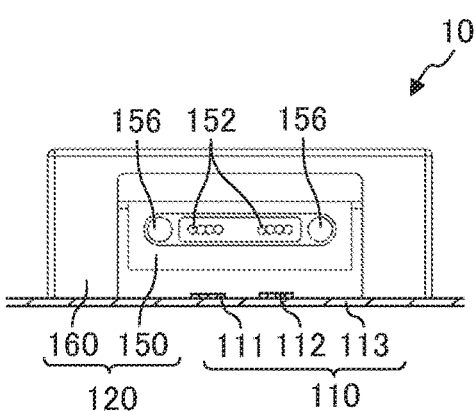
Figure 1B:
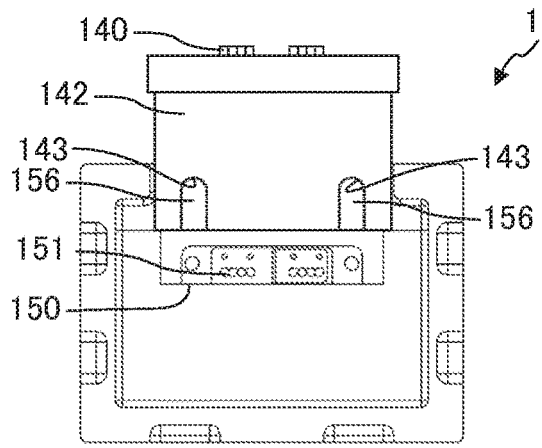
Figure 1D:
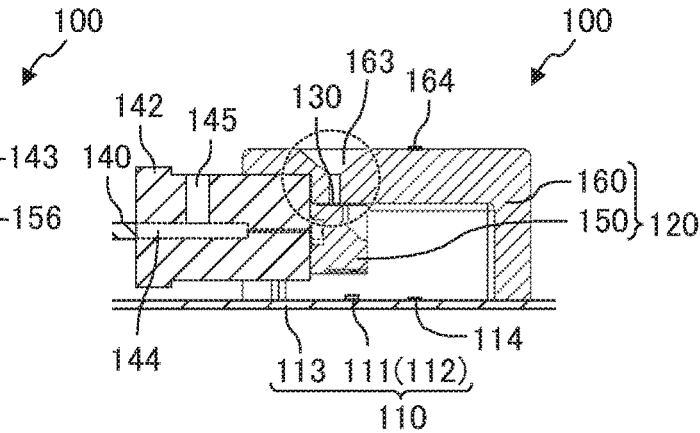
Figure 1E:
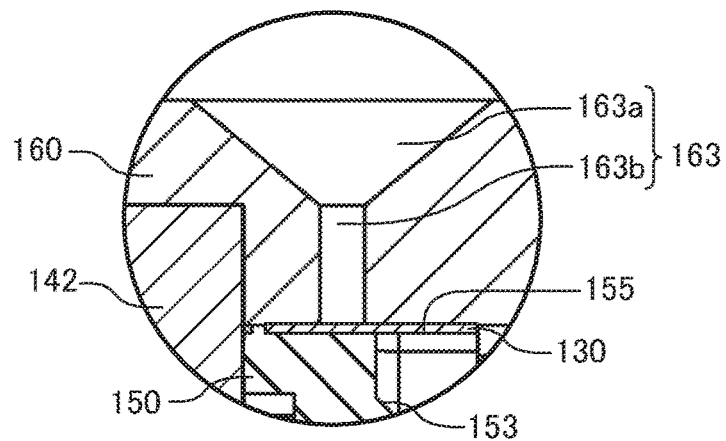

FIGS. 1A to 1E illustrate a configuration of optical module 100 according to an embodiment of the present invention. FIG. 1A is a plan view of optical module 100, FIG. 1B is a bottom view of optical module 100, FIG. 1C is a front view optical module 100, FIG. 1D is a sectional view taken along line A-A of FIG. 1A, and FIG. 1E is an enlarged view of a region indicated with a dotted line in FIG. 1D. Note that optical transmission member 140 and ferrule 142 are also illustrated in FIGS. 1A, 1B, 1D and 1E.

As illustrated in FIGS. 1A to 1E, optical module 100 includes photoelectric conversion device 110 of a substrate mounting type including photoelectric conversion elements such as light-emitting element 111 and light-receiving element 112; and optical receptacle 120. Optical module 100 is used in the state where optical transmission member 140 is connected with optical receptacle 120.

Photoelectric conversion device 110 includes substrate 113 and a photoelectric conversion element. Optical module 100 for transmission uses light-emitting element 111 as a photoelectric conversion element. Optical module 100 for reception uses light-receiving element 112 as a photoelectric conversion element. Optical module 100 for transmission and reception uses light-emitting element 111 and light-receiving element 112 as photoelectric conversion elements. In the present embodiment, optical module 100 for transmission and reception including light-emitting element 111 and light-receiving element 112 is described.

Substrate 113 is, for example, a glass composite substrate, a glass epoxy substrate, a flexible substrate or the like. Light-emitting element 111 and light-receiving element 112 are disposed on substrate 113. In addition, first alignment mark 114 is formed in one surface of substrate 113 on which light-emitting element 111 and light-receiving element 112 are disposed.

Light-emitting element 111, which is disposed on substrate 113, emits laser light in a direction perpendicular to the surface of substrate 113 on which light-emitting element 111 is disposed. The number of light-emitting element 111 is not limited. In the present embodiment, four light-emitting elements 111 are provided. Also, the position of light-emitting element 111 is not limited. In the present embodiment, four light-emitting elements 111 are arranged at a constant interval along the arrangement direction of optical transmission member 140. Light-emitting element 111 is a vertical-cavity surface-emitting laser (VCSEL), for example. Note that in the case where optical transmission members 140 are arranged in two or more lines, the number of the lines of arranged light-emitting elements 111 may be identical to that of optical transmission members 140.

Light-receiving element 112 is disposed on substrate 113 and receives reception light emitted from optical transmission member 140. The number of light-receiving elements 112 is not limited. In the present embodiment, four light-receiving elements 112 are provided. Also, the position of light-receiving element 112 is not limited. In the present embodiment, four light-receiving elements 112 are arranged in one line at a constant interval along the arrangement direction of optical transmission member 140. To be more specific, in plan view of substrate 113, four light-receiving elements 112 are arranged on the straight line along which four light-emitting elements 111 are arranged. Light-receiving element 112 is a photodiode (PD), for example. Note that in the case where optical transmission members 140 are arranged in two or more lines, the number of the lines of the arranged light-receiving elements 112 may be identical to that of optical transmission members 140.

First alignment mark 114 is used in the method of manufacturing optical module 100 described later, as a reference for positioning optical receptacle 120 with respect to substrate 113. The configuration of first alignment mark 114 is not limited as long as the above-described function can be ensured. First alignment mark 114 may be a recess, a protrusion, or a painted pattern provided to substrate 113. In addition, the shape of first alignment mark 114 in plan view may be, but not limited to, a circle or a polygon. Also, the position of first alignment mark 114 is not limited. As viewed from the photoelectric conversion element (light-emitting element 111 and light-receiving element 112), first alignment mark 114 may be disposed on the optical transmission member 140 side, or on the side opposite to optical transmission member 140. In the present embodiment, first alignment mark 114 is disposed on the side opposite to optical transmission member 140 as viewed from the photoelectric conversion element (light-emitting element 111 and light-receiving element 112).

The type of optical transmission member 140 is not limited, and optical transmission member 140 may be an optical fiber, a light waveguide or the like. In the present embodiment, optical transmission member 140 is an optical fiber. The optical fiber may be of a single mode type, or a multiple mode type. The number of optical transmission member 140 is not limited. In the present embodiment, eight optical fibers are arranged in one line at a constant interval. Note that optical transmission member 140 may be arranged in two or more lines.

Ferrule 142 holds an end portion of optical transmission member 140, and sets the position of an end surface of optical transmission member 140 with respect to second optical surface 152 of optical receptacle main body 150. Ferrule 142 is configured to hold an end portion of optical transmission member 140, and is configured to be detachable with respect to optical receptacle main body 150. Ferrule 142 is formed in a cylindrical shape. Optical transmission member 140 is inserted to hollow region 144 of ferrule 142. In addition, adhesive agent inlet 145 communicated with hollow region 144 is formed in the top surface of ferrule 142.

In the state where optical receptacle 120 is disposed between the photoelectric conversion element and optical transmission member 140, optical receptacle 120 optically connects the light-emitting surfaces of a plurality of light-emitting elements 111 and end surfaces of a plurality of optical transmission members 140 in one-to-one relationship. Optical transmission member 140 is fixed to ferrule 142 by inserting optical transmission member 140 to a hollow region of ferrule 142 and supplying adhesive agent from adhesive agent inlet 145. In addition, optical receptacle 120 optically couples the light reception surfaces of a plurality of light-receiving elements 112 and the end surfaces of a plurality of optical transmission members 140 in one-to-one relationship. The configuration of optical receptacle 120 is now described in detail.

Configuration of Optical Receptacle

Optical receptacle 120 includes optical receptacle main body 150, supporting member 160 for supporting optical receptacle main body 150, and adhesive agent 130 for bonding optical receptacle main body 150 and supporting member 160 to each other. The "adhesive agent" herein means to include an uncured adhesive agent having a predetermined fluidity, and a cured product.

Figure 2:
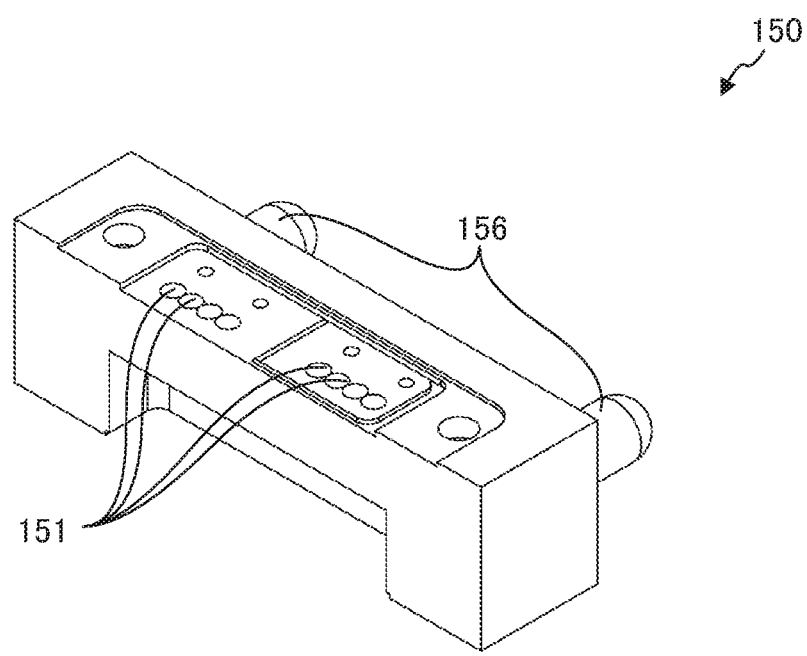
FIG. 2 is a perspective view of an optical receptacle main body as viewed from a first optical surface side.
Figure 3A:
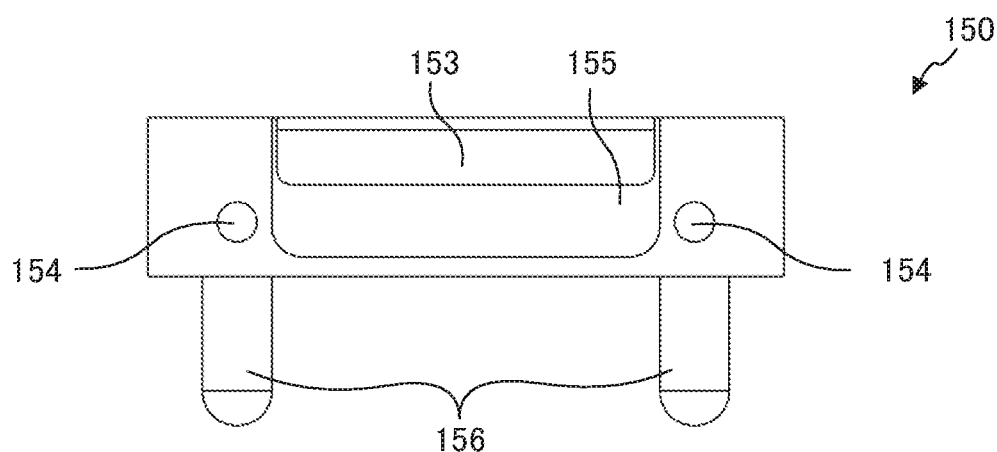
FIGS. 3A to 3C illustrate a configuration of the optical receptacle main body.
Figure 3B:
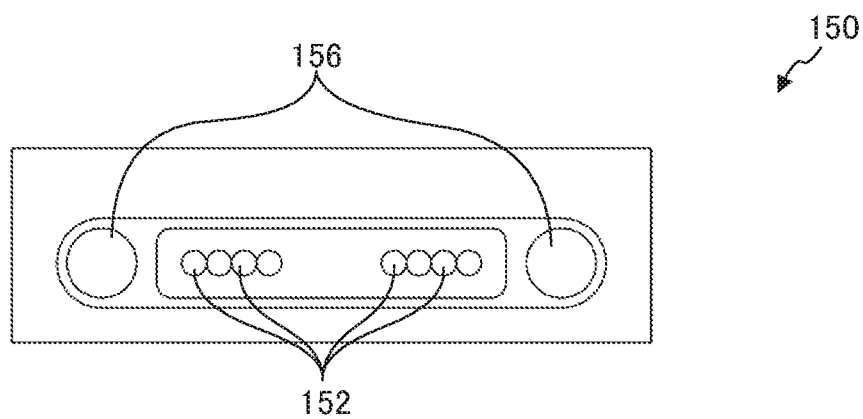
Figure 3C:
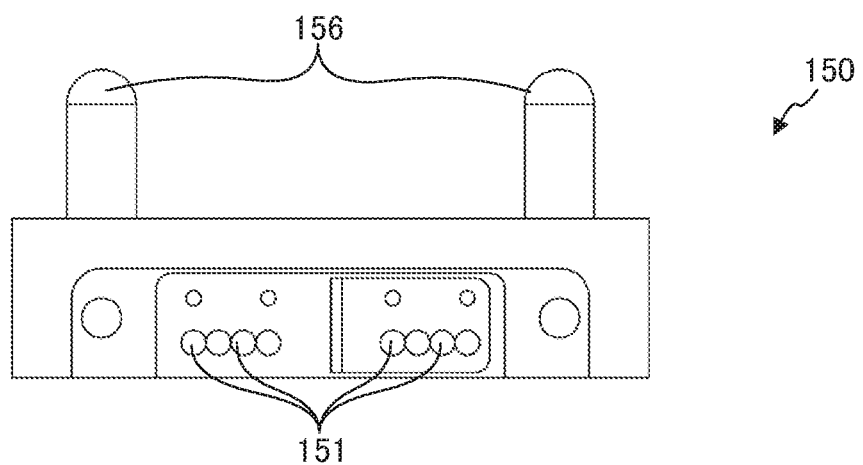
Figure 4A:
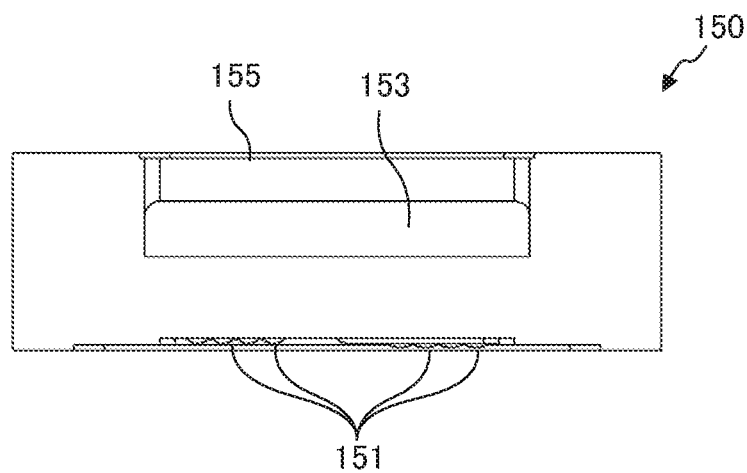
FIGS. 4A and 4B illustrate a configuration of the optical receptacle main body.
Figure 4B:
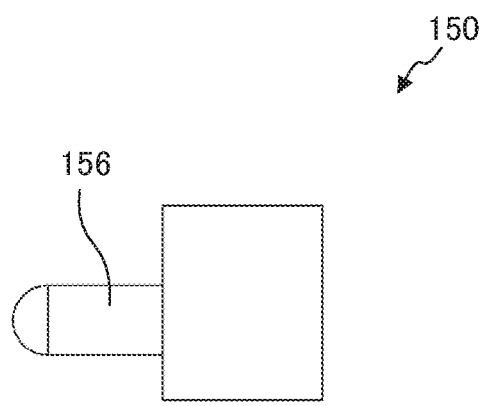

FIGS. 2 to 4B illustrate a configuration of optical receptacle main body 150. FIG. 2 is a perspective view of optical receptacle main body 150 as viewed from first optical surface 151 side. FIG. 3A is a plan view of optical receptacle main body 150, FIG. 3B is a front view of optical receptacle main body 150, and FIG. 3C is a bottom view of optical receptacle main body 150. FIG. 4A is a back view of optical receptacle main body 150, and FIG. 4B is a right side view of optical receptacle main body 150.

As illustrated in FIGS. 2 to 4B, optical receptacle main body 150 is a member having a substantially cuboid shape. Optical receptacle main body 150, which is optically transparent, emits, toward the end surface of optical transmission member 140, transmission light emitted from the light-emitting surface of light-emitting element 111, and emits, toward the light reception surface of light-receiving element 112, reception light emitted from optical transmission member 140. Optical receptacle main body 150 includes a plurality of first optical surfaces 151, a plurality of second optical surfaces 152, reflection surface 153, first fitting part 154, and ferrule protrusion 156. Optical receptacle main body 150 is formed of a material that is transparent to wavelengths of the light used for optical communications. Examples of such a material include transparent resins such as polyetherimide (PEI) and cyclic olefin resin.

First optical surface 151 is an optical surface that allows transmission light emitted from light-emitting element 111 to enter optical receptacle main body 150 while refracting the light. Also, first optical surface 151 emits, toward light-receiving element 112, reception light from optical transmission member 140 that has traveled inside optical receptacle 120 while refracting the light. In the present embodiment, first optical surface 151 has a shape of a convex lens surface protruding toward light-emitting element 111 (light-receiving element 112). First optical surface 151 converts transmission light emitted from light-emitting element 111 into collimated light. In addition, first optical surface 151 causes convergence of collimated light (reception light) having traveled inside optical receptacle 120. In addition, in the present embodiment, a plurality of (eight) first optical surfaces 151 are arranged opposite the light-emitting surface of light-emitting element 111 and the light reception surface of light-receiving element 112 in one line on the bottom surface of optical receptacle 120 along the arrangement direction of the light-emitting surface of light-emitting element 111 and the light reception surface of light-receiving element 112. In addition, the height of first optical surface 151 with respect to the photoelectric conversion element (light-emitting element 111 or light-receiving element 112) is not limited and may be appropriately set. In addition, first optical surface 151 has a circular shape in plan view. Preferably, the central axis of first optical surface 151 is perpendicular to the light-emitting surface of light-emitting element 111 and the light reception surface of light-receiving element 112. In addition, preferably, the central axis of first optical surface 151 matches the optical axis of light emitted from light-emitting element 111 (reception light incident on light-receiving element 112).

Light having been entered from first optical surface 151 advances toward reflection surface 153. In addition, reception light emitted from first optical surface 151 advances toward light-receiving element 112. Note that in the case where light-emitting elements 111 and light-receiving elements 112 are arranged in two or more lines, the number of the lines of arranged first optical surfaces 151 is identical to that of light-emitting elements 111 and light-receiving elements 112.

In the present embodiment, eight first optical surfaces 151, four first optical surfaces 151 on the right side are transmission-side first optical surfaces 151, and four first optical surfaces 151 on the left side are reception-side first optical surfaces 151 as illustrated in FIGS. 2 and 3C. That is, transmission light from light-emitting element 111 is incident on four transmission-side first optical surfaces 151 on the right side in the drawing, and reception light having traveled inside optical receptacle main body 150 is emitted from four reception-side first optical surfaces 151 on the left side in the drawing. In this manner, in optical receptacle main body 150 according to the present embodiment, one region, with respect to a plane that equally divides eight first optical surfaces 151 and is perpendicular to substrate 113, functions as the transmission side region, and the other region functions as the reception side region.

Second optical surface 152 is an optical surface that emits, toward the end surface of optical transmission member 140, transmission light having been entered from first optical surface 151 and having been reflected by reflection surface 153. Also, second optical surface 152 is an optical surface that allows, to enter optical receptacle 120, reception light emitted from the end surface of optical transmission member 140 while refracting the light. In the present embodiment, second optical surface 152 has a shape of a convex lens protruding toward the end surface of optical transmission member 140. Second optical surface 152 causes transmission light having traveled inside optical receptacle main body 150 to converge toward the end surface of optical transmission member 140, and converts reception light emitted from the end surface of optical transmission member 140 into collimated light. In addition, in the present embodiment, a plurality of (eight) second optical surfaces 152 are arranged in one line along the arrangement direction of optical transmission member 140 in the front surface of optical receptacle 120 such that each of second optical surfaces 152 is opposite to the end surface of optical transmission member 140. In addition, second optical surface 152 has a circular shape in plan view. Preferably, the central axis of second optical surface 152 is perpendicular to the end surface of optical transmission member 140. In addition, preferably, the central axis of second optical surface 152 matches the optical axis of light emitted from optical transmission member 140. Note that in the case where optical transmission members 140 are arranged in two or more lines, the number of the lines of arranged second optical surfaces 152 is identical to that of optical transmission members 140.

Reflection surface 153 is disposed on the top surface side of optical receptacle main body 150, and reflection surface 153 reflects, toward second optical surface 152, transmission light having been entered from first optical surface 151. In addition, reflection surface 153 reflects, toward first optical surface 151, reception light having been entered from second optical surface 152. In the present embodiment, reflection surface 153 is tilted such that the distance from second optical surface 152 (optical transmission member 140) increases in a direction from the top surface toward the bottom surface of optical receptacle 120. The inclination angle of reflection surface 153 is 45° with respect to the optical axis of transmission light having been entered from first optical surface 151 and the optical axis of reception light having been entered from second optical surface 152.

First fitting part 154 is disposed in a surface opposite to the surface where first optical surface 151 is disposed, and is fitted to second fitting part 162 of supporting member 160. With this configuration, optical receptacle main body 150 is supported by supporting member 160. The shape of first fitting part 154 is not limited as long as the above-described function can be ensured. First fitting part 154 is disposed in the top surface of optical receptacle main body 150 on the side opposite to the bottom surface side of optical receptacle main body 150 where first optical surface 151 is disposed. In addition, the shape and the number of first fitting part 154 are not limited as long as the above-described function can be ensured. First fitting part 154 may have a recessed shape or a protruding shape. In the present embodiment, first fitting part 154 has a shape of a cylindrical recess opening at the top surface of optical receptacle main body 150. In addition, in the present embodiment, two first fitting parts 154 are provided.

Adhesive agent recess (recess) 155 is disposed on a surface (top surface) side where first fitting part 154 is disposed. Adhesive agent 130 is disposed in adhesive agent recess 155. In addition, through hole 163 of supporting member 160 described later is disposed at a position opposite to adhesive agent recess 155. The shape of adhesive agent recess 155 is not limited as long as adhesive agent 130 can be injected to the inside and can be cured. From the viewpoint of ensuring the bonding power between optical receptacle main body 150 and supporting member 160, it is preferable that adhesive agent recess 155 have a shape with which the contact area between supporting member 160 and adhesive agent 130 in adhesive agent recess 155 is large. The depth of adhesive agent recess 155 is appropriately set by the flowability of adhesive agent 130. For example, preferably, the depth of adhesive agent recess 155 is about 0.1 mm to 0.5 mm, or more preferably, about 0.3 mm. In addition, regarding the position and the size of adhesive agent recess 155, it is preferable to dispose adhesive agent recess 155 at a position communicated with through hole 163 such that the left and right balance is ensured in plan view of optical receptacle 120. In the present embodiment, one adhesive agent recess 155 is disposed between two first fitting parts 154.

In the present embodiment, adhesive agent recess 155 opens at a position other than reflection surface 153 on the surface side where first fitting part 154 is disposed, but does not open at the surface side where second optical surface 152 is disposed. With this configuration, the light coupling efficiency is not degraded by adhesive agent 130 that is not cured and reaches second optical surface 152 or reflection surface 153 at the time of injection of adhesive agent 130.

Ferrule protrusion 156 fits in ferrule recess 143 of ferrule 142. With this configuration, the position of the end surface of optical transmission member 140 is set with respect to optical receptacle main body 150. Ferrule protrusion 156 is disposed on both sides of second optical surfaces 152.

Figure 5A:
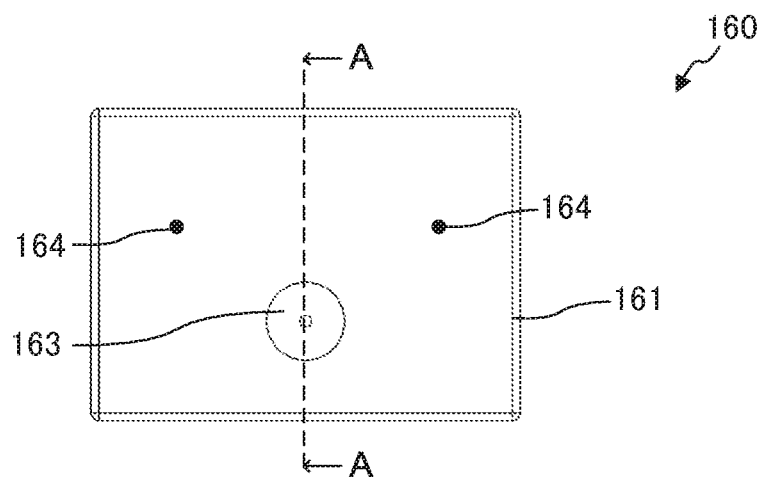
FIGS. 5A to 5C illustrate a configuration of a supporting member.
Figure 5B:
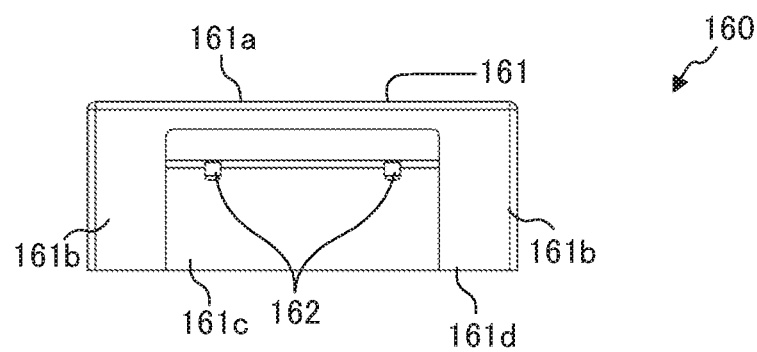
Figure 5C:
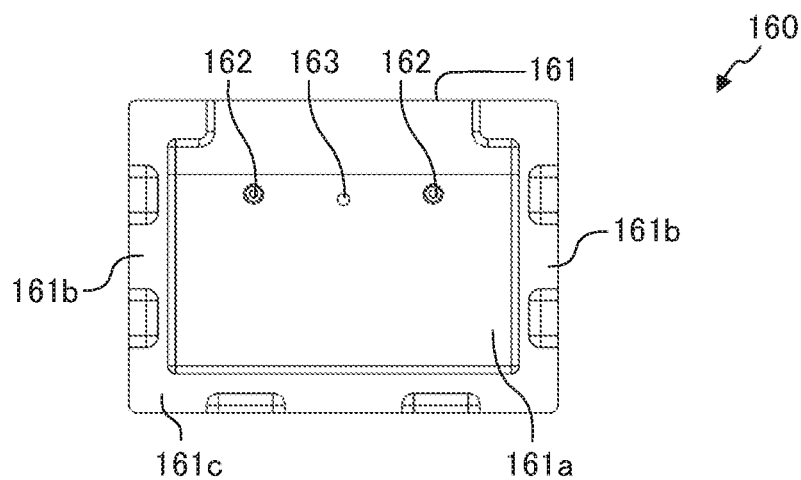
Figure 6A:
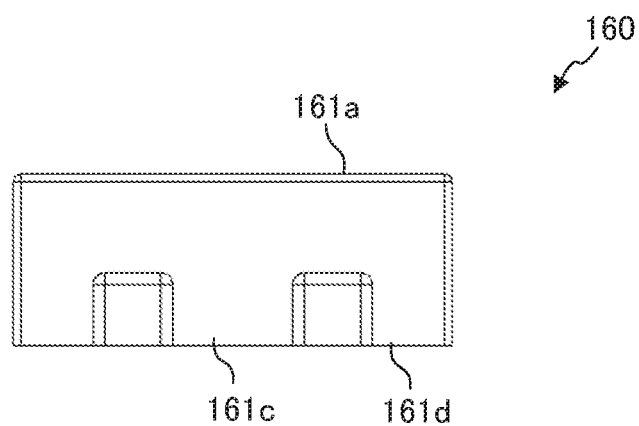
FIGS. 6A to 6C illustrate a configuration of the supporting member.
Figure 6B:
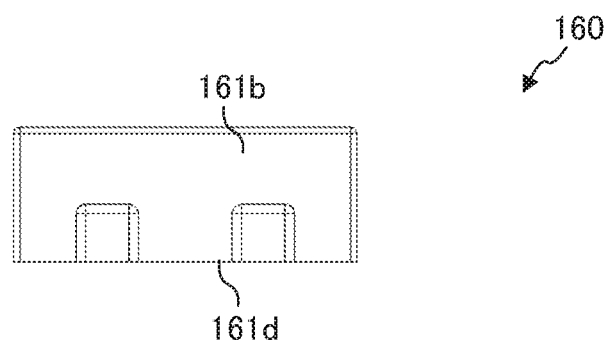
Figure 6C:
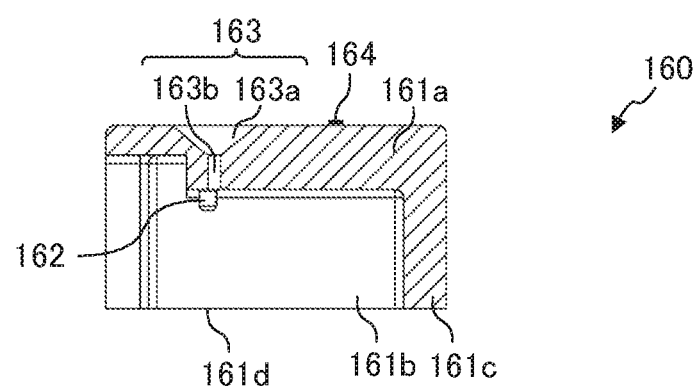

FIGS. 5A to 6C illustrate a configuration of supporting member 160. FIG. 5A is a plan view of supporting member 160, FIG. 5B is a front view of supporting member 160, and FIG. 5C is a bottom view of supporting member 160. FIG. 6A is a back view of supporting member 160, FIG. 6B is a right side view of supporting member 160, and FIG. 6C is a sectional view taken along line A-A of FIG. 5A.

Supporting member 160 supports optical receptacle main body 150 such that substrate 113 and optical receptacle main body 150 are separated from each other. As illustrated in FIGS. 5A to 6C, supporting member 160 includes supporting member main body 161, second fitting part 162 disposed inside supporting member main body 161, and through hole 163 formed in supporting member main body 161. The material of supporting member 160 may be or may not be optically transparent. In the present embodiment, supporting member 160 is made of an optically transparent resin such as polycarbonate (PC), polyetherimide (PEI), and polyether sulfone (PES).

Supporting member main body 161 supports optical receptacle main body 150 such that substrate 113 and optical receptacle main body 150 are separated from each other. As long as such a function can be ensured, the shape of supporting member main body 161 is not limited. In the present embodiment, the shape of supporting member main body 161 includes top plate 161a, a pair of side plates 161b and 161b that surround a part of top plate 161a, and back plate 161c that surrounds another part of top plate 161a so as to connect top plate 161a and the pair of side plates 161b and 161b. The bottom surfaces of the pair of side plates 161b and 161b and the bottom surface of back plate 161c function as installation surface 161d for installing optical receptacle 120 on substrate 113. Second fitting part 162 is disposed inside top plate 161a, and second alignment mark 164 is formed outside top plate 161*a*. In addition, through hole 163 is formed in top plate 161*a*. The height of the pair of side plates 161*b* and 161*b* is greater than that of optical receptacle main body 150. With this configuration, optical receptacle main body 150 is disposed on supporting member 160 side with respect to installation surface 161*d*. In addition, in other words, when optical receptacle main body 150 is fixed inside top plate 161*a* of supporting member main body 161, a space is formed in the region below optical receptacle main body 150.

Second fitting part 162 is fitted with first fitting part 154 of optical receptacle main body 150. With this configuration, the position of optical receptacle main body 150 with respect to supporting member 160 is set. Second fitting part 162 has a shape that is substantially complementary to first fitting part 154 of optical receptacle main body 150, and second fitting part 162 is disposed at a position corresponding to first fitting part 154. Specifically, in the present embodiment, second fitting part 162 has a substantially columnar shape, and is disposed in the inner surface of top plate 161*a*.

Through hole 163 is a channel for injecting adhesive agent 130 into adhesive agent recess 155 of optical receptacle main body 150. Through hole 163 opens at the inner surface of supporting member main body 161 and the outer surface opposite to the inner surface of supporting member main body 161. Through hole 163 is formed such that the opening at the inner surface of supporting member main body 161 faces adhesive agent recess 155 of optical receptacle main body 150. The shape of through hole 163 is not limited as long as adhesive agent can be injected into adhesive agent recess 155 of optical receptacle main body 150 from the outer surface side of supporting member main body 161. Preferably, the opening of through hole 163 on the outside of supporting member main body 161 is equal to or greater than the opening of through hole 163 on the inside of supporting member main body 161 in view of improving the ease of injection of adhesive agent 130 into adhesive agent recess 155. That is, the cross-sectional area of through hole 163 may increase from the inner opening toward the outer opening, or may be constant from the inner opening to the outer opening in supporting member main body 161. Here, "the cross-sectional area of through hole 163" means a cross-section taken along a plane perpendicular to a straight line extending along the thickness direction of top plate 161*a* of supporting member main body 161 (the travelling direction of a light beam between first optical surface 151 and light-receiving element 112 or light-emitting element 111). In the present embodiment, through hole 163 includes tapered part 163*a* located on the outer side of supporting member 160, and slit part 163*b* that is continuous with tapered part 163*a* on the inner side of supporting member 160. In slit part 163*b*, the cross-sectional area of through hole 163 does not change from the inside to the outside of supporting member main body 161. In tapered part 163*a*, the cross-sectional area of through hole 163 increases from the inside toward the outside of supporting member main body 161. To be more specific, tapered part 163*a* has a bowl-like shape, and slit part 163*b* has a cylindrical shape. In addition, the inclination angle of the inner surface of tapered part 163*a* is constant.

Second alignment mark 164 is used in the method of manufacturing optical module 100 described later, as a reference for positioning optical receptacle 120 with respect to substrate 113. The configuration of second alignment mark 164 is not limited as long as the above-described function can be ensured. Second alignment mark 164 may be a recess, a protrusion, or a painted pattern formed in top plate 161*a*. In addition, the shape of first alignment mark 114 in plan view may be, but not limited to, a circle or a polygon. In the present embodiment, in plan view of optical module 100, second alignment mark 164 overlaps first alignment mark 114 (see FIG. 1D).

Adhesive agent 130 is injected to adhesive agent recess 155 of optical receptacle main body 150, and bonds optical receptacle main body 150 and supporting member main body 161. Adhesive agent 130 is disposed in adhesive agent recess 155 so as to make contact with the inner surface of adhesive agent recess 155 and the inner surface of supporting member main body 161. The type of adhesive agent 130 is not limited as long as adhesive agent 130 has a fluidity that allows injection into adhesive agent recess 155 via through hole 163 of supporting member main body 161, and optical receptacle main body 150 and supporting member main body 161 can be bonded with a required strength. Examples of adhesive agent 130 include an adhesive agent of epoxy resin and the like.

Configuration of Supporting Member of Modification

Figure 7A:
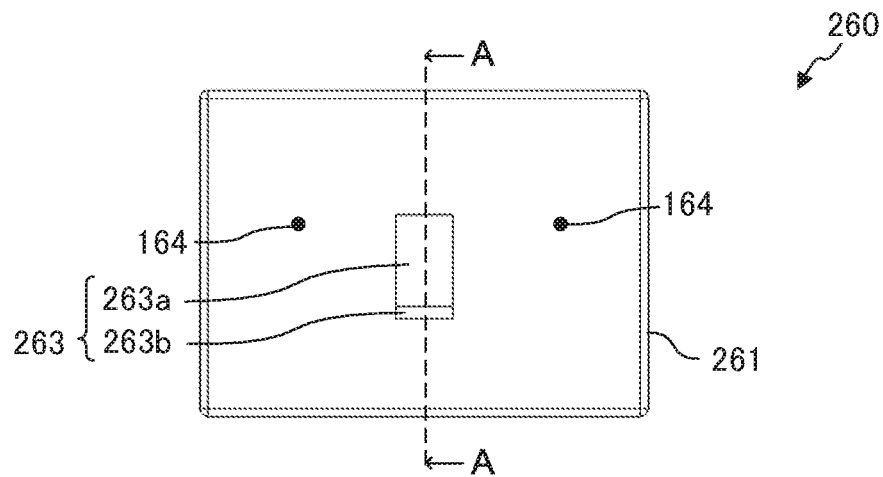
FIGS. 7A to 7C illustrate a configuration of a supporting member of a modification.
Figure 7B:
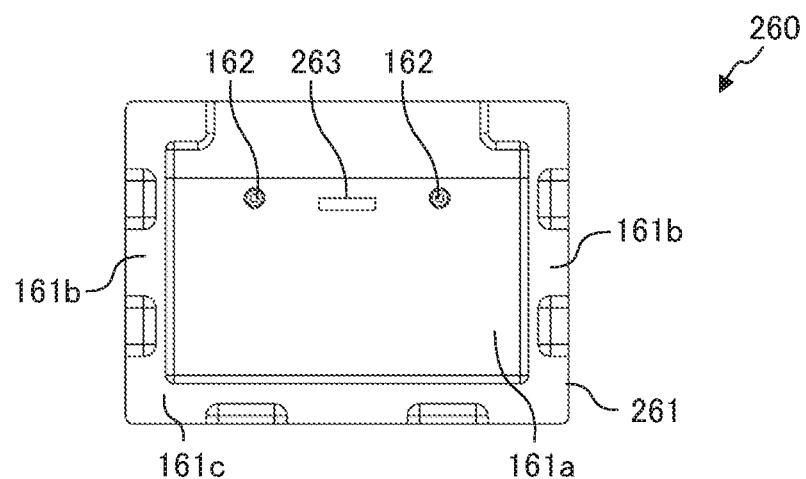
Figure 7C:
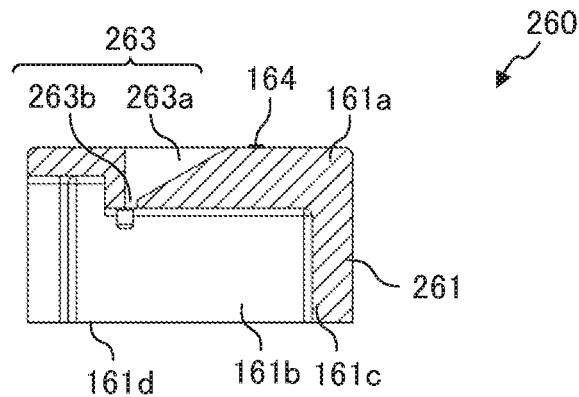

FIGS. 7A to 7C illustrate a configuration of supporting member 260 of a modification. FIG. 7A is a plan view of supporting member 260 of the modification, FIG. 7B is a bottom view of supporting member 260, and FIG. 7C is a sectional view taken along line A-A of FIG. 7A.

As illustrated in FIGS. 7A to 7C, supporting member 260 of the modification includes supporting member main body 261, second fitting part 162, and through hole 263. Through hole 263 includes tapered part 263*a* and slit part 263*b*. In plan view, each of tapered part 263*a* and slit part 263*b* has a rectangular shape.

Method of Manufacturing Optical Module

Optical module 100 according to the present embodiment can be manufactured by the following method, for example. The method of manufacturing optical module 100 includes a step of producing optical receptacle 120, and a step of fixing optical receptacle 120 to photoelectric conversion device 110.

In the step of producing optical receptacle 120, optical receptacle main body 150 and supporting member 160 are separately shaped by injection molding, and thereafter optical receptacle main body 150 is mounted to supporting member 160. To be more specific, first fitting part 154 of optical receptacle main body 150 and second fitting part 162 of supporting member 160 are fitted to each other. In this manner, the positional relationship between supporting member 160 and optical receptacle main body 150 is maintained. Next, adhesive agent 130 is injected into adhesive agent recess 155 from the outside via through hole 163 of supporting member 160 with a dispenser, for example. Adhesive agent 130 flows into adhesive agent recess 155 through tapered part 163*a* and slit part 163*b*. By curing adhesive agent 130 in this state, optical receptacle main body 150 and supporting member 160 are bonded to each other.

In the step of fixing optical receptacle 120 to substrate 113 where photoelectric conversion element is disposed, optical receptacle 120 is fixed to substrate 113 where photoelectric conversion element is disposed on the basis of first alignment mark 114 and second alignment mark 164. To be more specific, optical receptacle 120 is positioned with respect to substrate 113 such that first alignment mark 114 and second alignment mark 164 overlap each other when optical module 100 is viewed from supporting member 160 side. Then, in the state where first alignment mark 114 and second alignment mark 164 overlap each other, substrate 113 and optical receptacle 120 (supporting member 160) are fixed with each other with adhesive agent 130, for example.

Effect

As described above, in optical receptacle 120 according to the present embodiment, optical receptacle main body 150 does not make contact with substrate 113 when optical receptacle 120 is disposed on substrate 113, and accordingly a space is interposed between substrate 113 and optical receptacle main body. Thus, optical receptacle 120 according to the present embodiment can achieve high degree of freedom for installation (design) of other optical components and electronic components. In addition, optical receptacle 120 is easy to assemble since optical receptacle main body 150 and supporting member 160 can be fixed by injecting adhesive agent 130 into adhesive agent recess 155 of the optical receptacle main body via through hole 163 of supporting member 160 from the outside.

While first fitting part 154 is a recess and second fitting part 162 is a protrusion in the present embodiment, first fitting part 154 may be a protrusion, and second fitting part 162 may be a recess.

This application is entitled to and claims the benefit of Japanese Patent Application No. 2016-238700 filed on Dec. 8, 2016, the disclosure each of which including the specification, drawings and abstract is incorporated herein by reference in its entirety.

INDUSTRIAL APPLICABILITY

The optical receptacle and the optical module according to the embodiment of the present invention are suitable for optical communications using an optical transmission member, for example.

REFERENCE SIGNS LIST

100 Optical module
110 Photoelectric conversion device
111 Light-emitting element
112 Light-receiving element
113 Substrate
114 First alignment mark
120 Optical receptacle
130 Adhesive agent
140 Optical transmission member
142 Ferrule
143 Ferrule recess
144 Hollow region
145 Adhesive agent inlet
150 Optical receptacle main body
151 First optical surface
152 Second optical surface
153 Reflection surface
154 First fitting part
155 Adhesive agent recess
156 Ferrule protrusion
160, 260 Supporting member
161, 261 Supporting member main body
161a Top plate
161b Side plate
161c Back plate
161d Installation surface
162 Second fitting part
163, 263 Through hole
163a, 263a Tapered part
163b, 263b Slit part
164 Second alignment mark

What is claimed is:

1. An optical receptacle configured to be disposed between an optical transmission member and a photoelectric conversion device including a photoelectric conversion element disposed on a substrate, the optical receptacle being configured to optically couple the photoelectric conversion element and an end surface of the optical transmission member, the optical receptacle comprising:
an optical receptacle main body;
a supporting member configured to support the optical receptacle main body; and
an adhesive agent configured to bond the optical receptacle main body and the supporting member,
wherein the optical receptacle main body includes:
a first optical surface configured to allow incidence of transmission light emitted from the photoelectric conversion element, or to emit, toward the photoelectric conversion element, reception light having passed through inside of the optical receptacle main body after being emitted from the end surface of the optical transmission member,
a second optical surface configured to emit, toward the optical transmission member, the transmission light having passed through the inside of the optical receptacle main body after being emitted from the photoelectric conversion element, or to allow incidence of the reception light emitted from the optical transmission member,
a reflection surface configured to reflect, toward the second optical surface, the transmission light incident on the first optical surface, or to reflect, toward the first optical surface, the reception light incident on the second optical surface,
a first fitting part disposed in a surface opposite to a surface where the first optical surface is disposed, and
a recess formed on a side of the surface where the first fitting part is disposed,
wherein the supporting member includes:
a supporting member main body including an installation surface for installation to the substrate,
a second fitting part disposed in an inner surface of the supporting member main body, the inner surface facing the surface where the first fitting part of the optical receptacle main body is disposed, the second fitting part being fitted with the first fitting part, and
a through hole facing the recess of the optical receptacle main body and opening at the inner surface and an outer surface of the supporting member main body, the outer surface being opposite to the inner surface,
wherein the adhesive agent is disposed in the recess of the optical receptacle main body such that the adhesive agent makes contact with an inner surface of the recess and the inner surface of the supporting member main body, and
wherein the optical receptacle main body is located on a side of the supporting member with respect to the installation surface.

2. The optical receptacle according to claim 1, wherein, on the side of the surface where the first fitting part is disposed, the recess opens at a position other than a position of the reflection surface, and does not open on a side of a surface where the second optical surface disposed.

3. The optical receptacle according to claim 2, wherein a size of an opening of the through hole at the outer surface of the supporting member main body is equal to or greater than a size of an opening of the through hole at the inner surface of the supporting member main body.

4. An optical module, comprising:
   a photoelectric conversion device including a substrate and a photoelectric conversion element disposed on the substrate; and
   the optical receptacle according to claim 3,
   wherein the substrate and the optical receptacle main body are separated from each other.

5. A method of manufacturing the optical module according to claim 4, the method comprising:
   producing the optical receptacle by injecting the adhesive agent to the recess of the optical receptacle main body from the through hole of the supporting member in a state where the first fitting part of the optical receptacle main body and the second fitting part of the supporting member are fitted with each other, and by curing the adhesive agent to bond the optical receptacle main body and the supporting member to each other, and
   fixing the optical receptacle to the substrate where the photoelectric conversion element is disposed such that the substrate and the optical receptacle main body are separated from each other.

6. An optical module, comprising:
   a photoelectric conversion device including a substrate and a photoelectric conversion element disposed on the substrate; and
   the optical receptacle according to claim 2,
   wherein the substrate and the optical receptacle main body are separated from each other.

7. A method of manufacturing the optical module according to claim 6, the method comprising:
   producing the optical receptacle by injecting the adhesive agent to the recess of the optical receptacle main body from the through hole of the supporting member in a state where the first fitting part of the optical receptacle main body and the second fitting part of the supporting member are fitted with each other, and by curing the adhesive agent to bond the optical receptacle main body and the supporting member to each other, and
   fixing the optical receptacle to the substrate where the photoelectric conversion element is disposed such that the substrate and the optical receptacle main body are separated from each other.

8. The optical receptacle according to claim 1, wherein a size of an opening of the through hole at the outer surface of the supporting member main body is equal to or greater than a size of an opening of the through hole at the inner surface of the supporting member main body.

9. An optical module, comprising:
   a photoelectric conversion device including a substrate and a photoelectric conversion element disposed on the substrate; and
   the optical receptacle according to claim 8,
   wherein the substrate and the optical receptacle main body are separated from each other.

10. A method of manufacturing the optical module according to claim 9, the method comprising:
    producing the optical receptacle by injecting the adhesive agent to the recess of the optical receptacle main body from the through hole of the supporting member in a state where the first fitting part of the optical receptacle main body and the second fitting part of the supporting member are fitted with each other, and by curing the adhesive agent to bond the optical receptacle main body and the supporting member to each other, and
    fixing the optical receptacle to the substrate where the photoelectric conversion element is disposed such that the substrate and the optical receptacle main body are separated from each other.

11. An optical module, comprising:
    a photoelectric conversion device including a substrate and a photoelectric conversion element disposed on the substrate; and
    the optical receptacle according to claim 1,
    wherein the substrate and the optical receptacle main body are separated from each other.

12. A method of manufacturing the optical module according to claim 11, the method comprising:
    producing the optical receptacle by injecting the adhesive agent to the recess of the optical receptacle main body from the through hole of the supporting member in a state where the first fitting part of the optical receptacle main body and the second fitting part of the supporting member are fitted with each other, and by curing the adhesive agent to bond the optical receptacle main body and the supporting member to each other, and
    fixing the optical receptacle to the substrate where the photoelectric conversion element is disposed such that the substrate and the optical receptacle main body are separated from each other.

* * * * *